United States Patent
Lichtenegger et al.

(10) Patent No.: US 9,385,667 B2
(45) Date of Patent: Jul. 5, 2016

(54) PHOTODETECTOR INTEGRATED CIRCUIT (IC) HAVING A SENSOR INTEGRATED THEREON FOR SENSING ELECTROMAGNETIC INTERFERENCE (EMI)

(71) Applicant: Avago Technologies General IP (Singapore) Pte. Ltd., Singapore (SG)

(72) Inventors: Thomas Lichtenegger, Alteglofsheim (DE); Martin Weigert, Etterzhausen/Nittendorf (DE); Robert Swoboda, Vienna (AT)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 372 days.

(21) Appl. No.: 13/917,955

(22) Filed: Jun. 14, 2013

(65) Prior Publication Data

US 2014/0367556 A1    Dec. 18, 2014

(51) Int. Cl.
*H03F 3/08* (2006.01)
*G01J 1/44* (2006.01)
*G01J 1/42* (2006.01)

(52) U.S. Cl.
CPC .................. *H03F 3/08* (2013.01); *G01J 1/4228* (2013.01); *G01J 2001/444* (2013.01)

(58) Field of Classification Search
CPC ........... H03F 3/08; H03F 3/087; H03F 3/085; G01J 1/44; G01J 1/1626; G01J 1/42; G01J 2001/1663; G01J 1/4228; G01J 2001/444; H01J 40/14
USPC ..... 250/214.1, 214 R, 214 A, 214 AL, 214 C, 250/214 B, 551; 356/433, 435, 218, 222, 356/229, 230
See application file for complete search history.

(56) References Cited

U.S. PATENT DOCUMENTS

| 4,565,974 | A  * | 1/1986  | Smoot ............................ 330/304 |
| 5,266,792 | A  * | 11/1993 | Crowne ..................... G01J 1/18 250/214 C |
| 5,697,958 | A  * | 12/1997 | Paul et al. ........................ 607/31 |
| 6,483,304 | B1 * | 11/2002 | Kou et al. ....................... 324/258 |
| 7,224,473 | B2 * | 5/2007  | Zalusky ............... G01C 15/006 250/208.2 |
| 7,406,268 | B2 * | 7/2008  | Schrodinger .................. 398/202 |
| 7,787,780 | B2 * | 8/2010  | Suzunaga ................. H03F 3/08 250/214 A |
| 2006/0007171 | A1 * | 1/2006 | Burdi et al. .................... 345/173 |
| 2008/0002993 | A1 * | 1/2008 | Kirkpatrick ............ H04B 10/67 398/202 |

FOREIGN PATENT DOCUMENTS

WO            9641203 A1    12/1996
WO         2012175226 A1    12/2012

OTHER PUBLICATIONS

Saswati Ghosh, Ajay Chakrabarty, Analysis of Different Sensors for Electric Field Measurements, Article, Jan. 15, 2007, p. 1-9, Kalpana Chawla Space Technology Cell, W.B., India.

* cited by examiner

*Primary Examiner* — Pascal M Bui Pho
*Assistant Examiner* — Jennifer Bennett

(57) ABSTRACT

A photodetector integrated circuit (IC) having an electromagnetic interference (EMI) sensor integrated therein is provided for sensing EMI at the photodetector. Integrating the EMI sensor into the photodetector IC ensures that the EMI sensor is in proximity to the photodetector so that any EMI that is sensed is actually EMI to which the photodetector is exposed. The sensed EMI may then be used for a number of reasons, such as to determine the root cause of damage to circuitry of the system, to determine the point in time at which an EMI event occurred, or to trigger a warning when a determination is made that an EMI limit has been reached.

24 Claims, 4 Drawing Sheets

US 9,385,667 B2

PHOTODETECTOR INTEGRATED CIRCUIT (IC) HAVING A SENSOR INTEGRATED THEREON FOR SENSING ELECTROMAGNETIC INTERFERENCE (EMI)

TECHNICAL FIELD OF THE INVENTION

The invention relates to photodetector integrated circuits (ICs), and more particularly, to photodetector ICs used in industrial applications.

BACKGROUND OF THE INVENTION

A photodetector is an optoelectronic device that senses light and converts the sensed light into an electrical signal. Many different types of photodetectors are available in the market. Photodetectors are well-suited for use as optical receivers for receiving optical signals and converting them into electrical signals. For this reason, photodetectors are often used in optical communications networks for receiving optical data signals that have been transmitted over an optical fiber and for converting the optical data signals into electrical data signals.

Photodetectors are sometimes used as optical isolators to electrically isolate different parts of a system from one another while allowing these parts of the system to be in communication with one another via an optical coupling. An optical isolator is a device that allows signals to be optically transferred between circuits or systems while keeping those circuits or systems electrically isolated from each other. Optical isolators are used in a wide variety of communications systems, control systems, and monitoring systems. In a typical optical isolator, an optical transmitter of the optical isolator is used to convert an electrical signal into an optical signal, which is then optically transmitted over air or over an optical waveguide to a photodetector. The photodetector converts the optical signal back to an electrical signal. The optical transmitter is typically a laser diode or light emitting diode (LED). The photodetector is typically a photodiode, such as a p-intrinsic-n (P-I-N) diode or a P-N diode.

Optical isolators and other types of optical systems are sometimes used in industrial applications, such as automated manufacturing systems and transportation systems, for example. In these types of industrial applications, very high electrical currents are commonly used. For example, in some drive applications, very high electrical currents are switched on and off at high frequency to drive large motors. The switching of these high electrical currents can produce EMI that can detrimentally affect the performance of other electrical circuits or components of the systems.

Optical systems, by nature, are not highly susceptible to EMI. For that reason, they are well suited for use in such industrial systems, although they have not been widely used in industrial systems heretofore. Optical systems typically include electronic or optoelectronic components that can potentially be detrimentally affected by EMI. In order to protect these components from the potentially detrimental affects of EMI, EMI events need to be sensed or monitored to determine when protective actions need to be taken or to determine changes that need to be made to the system to prevent future EMI events from detrimentally affecting system performance. Accordingly, a need exists for an EMI sensor and method for use in optical systems that are used in industrial applications.

SUMMARY OF THE INVENTION

The invention is directed to a photodetector IC chip having an EMI sensor integrated thereon, and to a method for sensing EMI in a photodetector IC. The photodetector IC chip comprises at least a first photodetector, first amplification circuitry electrically coupled to the first photodetector, an EMI sensor, and second amplification circuitry electrically coupled to the EMI sensor. The photodetector is configured to convert an optical signal into an electrical signal and to output the electrical signal. The first amplification circuitry amplifies the electrical signal output from the photodetector. The EMI sensor senses EMI and produces an electrical sense signal. The second amplification circuitry amplifies the electrical sense signal to produce an amplified electrical sense signal.

The method comprises the following: with a photodetector of the IC chip, converting an optical signal into an electrical signal and outputting the electrical signal; with first amplification circuitry of the IC chip electrically coupled to the photodetector, amplifying the output electrical signal; with an EMI sensor of the IC chip, sensing EMI and outputting an electrical sense signal; and with second amplification circuitry coupled to the EMI sensor, amplifying the electrical sense signal to produce an amplified electrical sense signal.

These and other features and advantages of the invention will become apparent from the following description, drawings and claims.

DETAILED DESCRIPTION OF AN ILLUSTRATIVE EMBODIMENT

Figure 1:
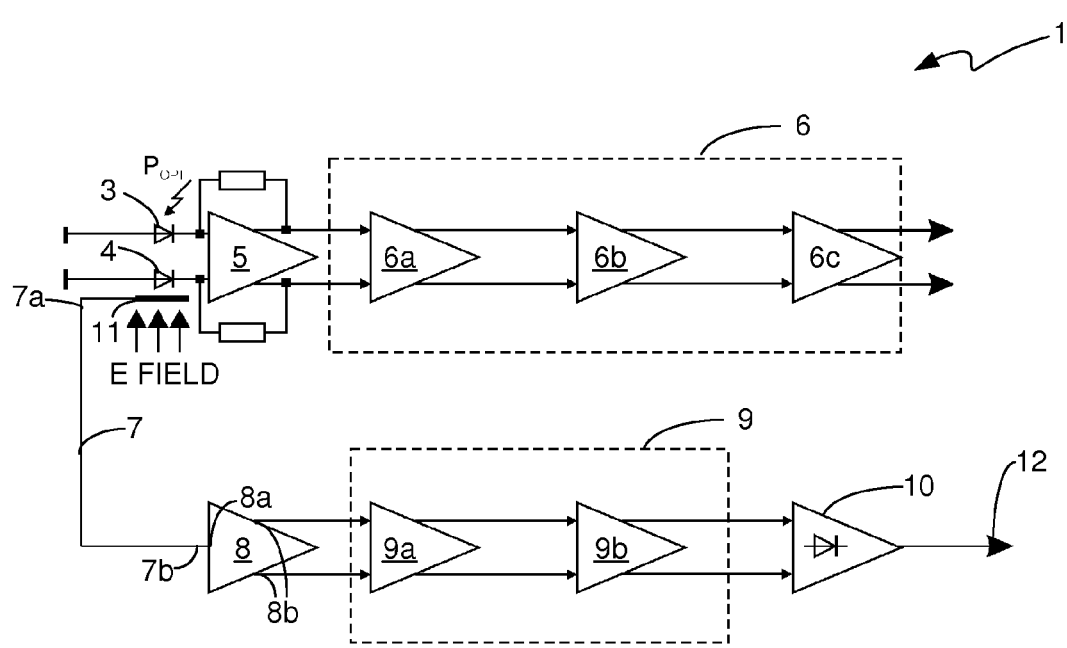
FIG. 1 illustrates a block diagram of a portion of a photodiode IC that includes first and second photodiodes, a transimpedance amplifier (TIA), an amplifier chain, an electrical conductor, a charge amplifier, a second amplifier chain, and a detector.

Purely optical elements of optical systems used in industrial applications are generally immune to EMI. However, in accordance with the invention, it has been determined that some of the electronic and optoelectronic components of such optical systems may be susceptible to EMI. For example, photodiodes are potentially susceptible to EMI. The electrical signal that is produced by a photodiode, which may be a current signal or a voltage signal, is typically very small in amplitude. For this reason, the photodiode is typically followed by some form of amplification circuitry that amplifies the electrical signal to produce a signal having an amplitude that is sufficiently high to enable the signal to be processed by other electrical circuitry downstream of the amplification circuitry, such as clock and data recovery (CDR) circuitry. The small amplitude of the output signal of the photodiode can be close to the amplitude of noise attributable to EMI on the output of the photodiode. Consequently, it may be difficult or impossible in some cases for the circuitry that processes the output of the photodiode to distinguish between the signal of interest and the noise, which can lead to performance problems in the optical systems and in the industrial system in which it is employed.

For this reason, it has been determined, in accordance with the invention, that it would be useful to sense EMI at one or more locations on a photodetector IC proximate the photodetector. In accordance with the illustrative, or exemplary, embodiments described herein, an EMI sensor is integrated into a photodetector IC. Integrating the EMI sensor into the photodetector IC ensures that the EMI sensor is in proximity to the photodetector so that any EMI that is sensed is actually EMI to which the photodetector is exposed. The sensed EMI may then be used for a number of purposes, such as to determine the root cause of damage to circuitry of the system, to determine the point in time at which an EMI event occurred, or to trigger a warning when a determination is made that an EMI limit has been reached. Various illustrative embodiments will now be described with reference to FIGS. 1-6, in which like reference numerals represent like components, features or elements.

For exemplary purposes, the embodiments described herein depict the photodetector as a photodiode. It should be noted, however, that the photodetector is not limited to being a photodiode. The photodetector may be any type of optical detector that converts photons into electricity. The photodetector is being described herein as a photodiode because of the above-described susceptibility of the photodiode to EMI. Those skilled in the art will understand, however, that the principles and concepts described herein apply to any type of photodetector, including, but not limited to, photodiodes.

FIG. 1 illustrates a block diagram of a portion of a photodiode IC 1 in accordance with an illustrative embodiment that includes first and second photodiodes 3 and 4, respectively, a transimpedance amplifier (TIA) 5, an amplifier chain 6, an electrical conductor 7, a charge amplifier 8, a second amplifier chain 9, and a detector 10. The second photodiode 4 is covered with a metal shield 11. The electrical conductor 7 is either an electrically-conductive wire bond or an electrically-conductive trace. The conductor 7 has a first end 7a that is connected to the metal shield 11 and a second end 7b that is connected to an input terminal 8a of the charge amplifier 8. The metal shield 11 acts as an electric field (E field) antenna in that the E field of any EMI that the metal shield 11 is exposed to causes electrical charge to accumulate on the metal shield 11. The accumulated electrical charge propagates along the conductor 7 from the first end 7a of the conductor 7 to the second end 7b of the conductor 7. The charge amplifier 8 then produces a differential output voltage at its output terminals 8b that is proportional to the electrical charge at its input terminal 8a.

The second amplifier chain 9 is made up of one or more differential amplifiers that amplify the differential voltage at the output terminals 8b of the charge amplifier 8. The gain of the second amplifier chain 9 is greater than unity. For exemplary purposes, the second amplifier chain 9 is shown as being made up of first and second differential amplifiers 9a and 9b, respectively, although the chain 9 could comprise any number of differential amplifiers or could be eliminated altogether if the charge amplifier 8 produces a differential output voltage having a sufficient amount of gain. The first differential amplifier 9a amplifies the differential voltage signal output by the charge amplifier 8 and produces a first amplified output differential voltage, which is input to the second differential amplifier 9b. The second differential amplifier 9b amplifies the first amplified output differential voltage to produce a second amplified output differential voltage, which is then input to the detector 10. The detector 10 is optional.

The detector 10 detects the second amplified output differential voltage and outputs an electrical signal 12 that is related to the level of the EMI to which the metal shield 11 was exposed. The electrical signal 12 is related to the level of the EMI to which the metal shield 11 is exposed by the responses of the amplifiers 8 and 9 and of the detector 10. Because these responses are known, a measurement of the EMI can be obtained from the electrical signal 12.

Figure 2:
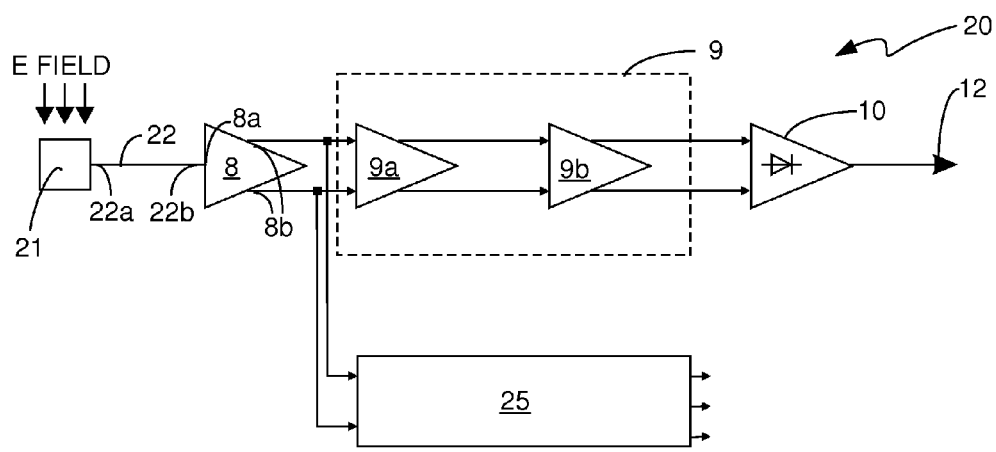
FIG. 2 illustrates a block diagram of a portion of a photodiode IC in accordance with another illustrative embodiment that includes the charge amplifier, the amplifier chain, and the detector shown in FIG. 1, and in addition includes an electrically-conductive pad and an electrical conductor.

FIG. 2 illustrates a block diagram of a portion of a photodiode IC 20 in accordance with another illustrative embodiment that includes the charge amplifier 8, the amplifier chain 9, and the detector 10 shown in FIG. 1, and in addition includes an electrically-conductive pad 21 and an electrical conductor 22, which may be a trace or a bond wire. For ease of illustration, the photodiode and the circuitry for amplifying the output of the photodiode are not shown in FIG. 2, but would be located proximate the circuitry shown in FIG. 2, e.g., next to the pad 21 and conductor 22. The photodiode (not shown) and amplification circuitry could include one or both of the photodiodes 3 and/or 4 shown in FIG. 1 and the amplifiers 5 and/or 6.

A first end 22a of the conductor 22 is connected to the pad 21 and a second end 22b of the conductor 22 is connected to the input terminal 8a of the charge amplifier 8. The electrically-conductive pad 21 may be a metal contact pad of the IC 20 or it may simply be an amount of electrically-conductive material that has been deposited at a suitable location on the IC 20 for the specific purpose of acting as an EMI antenna. The pad 21 acts as an E field antenna in that the E field of any EMI that the pad 21 is exposed to causes electrical charge to accumulate on the pad 21. The accumulated electric charge propagates along the conductor 22 from the first end 22a of the conductor 22 to the second end 22b of the conductor 22. The charge amplifier 8 then produces a differential output voltage at its output terminals 8b that is proportional to the electrical charge at its input terminal 8a.

Again, for exemplary purposes, the amplifier chain 9 is shown as comprising first and second differential amplifiers 9a and 9b, respectively, although it could comprise any number of differential amplifiers greater than one or be eliminated entirely if the charge amplifier 8 provides sufficient gain. The first differential amplifier 9a amplifies the voltage differential output by the charge amplifier 8 and produces a first amplified output differential voltage, which is input to the second differential amplifier 9b. The second differential amplifier 9b amplifies the first amplified output differential voltage to produce a second amplified output differential voltage, which is then input to the detector 10. The detector 10 detects the second amplified output differential voltage and outputs an electrical signal 12 that is related to the level of the EMI to which the pad 21 was exposed. As indicated above, because the responses of the amplifiers 8-9b and of the detector 10 are known, a measurement of the level of the EMI can be obtained from the electrical signal 12.

In accordance with this illustrative embodiment, the pad 21 is a test pad of the IC 20 and the IC 20 includes test circuitry 25 for performing one or more on-chip tests at the chip or wafer levels. The output terminals 8b of the charge amplifier 8 are connected to test circuitry 25. Thus, the test circuitry 25 uses the differential output voltage signal that is output from the charge amplifier 8 to perform testing. This embodiment allows a test pad that is already on the IC 20 for performing testing to also be used as an E field EMI antenna, which helps conserve space on the IC 20. The invention is not limited with respect to the type of tests that are performed by the testing circuitry 25. It is known to integrated test circuitry and test contact pads on ICs to enable chip-level or wafer-level tests to be performed, such as for the purpose of determining whether the chip or the wafer is defective.

The test circuitry 25 is not limited to producing a differential output even if it has differential inputs. The output of the test circuitry 25 may be a single-ended output signal and the output signal can be a digital or an analog signal. The differential inputs just stimulate the test circuitry 25. The test circuitry 25 has internal logic circuitry for generating test signals. The types of test signals that are generated depends on the IC functionality. The test circuitry 25 is typically activated by a forced direct current (DC) signal on the test pad 21 since such an event cannot be attributable to EMI. Additionally, a modulated AC signal can be used to generate different test signals, e.g. with a decoder that generates various test sequences at multiple outputs.

Figure 3:
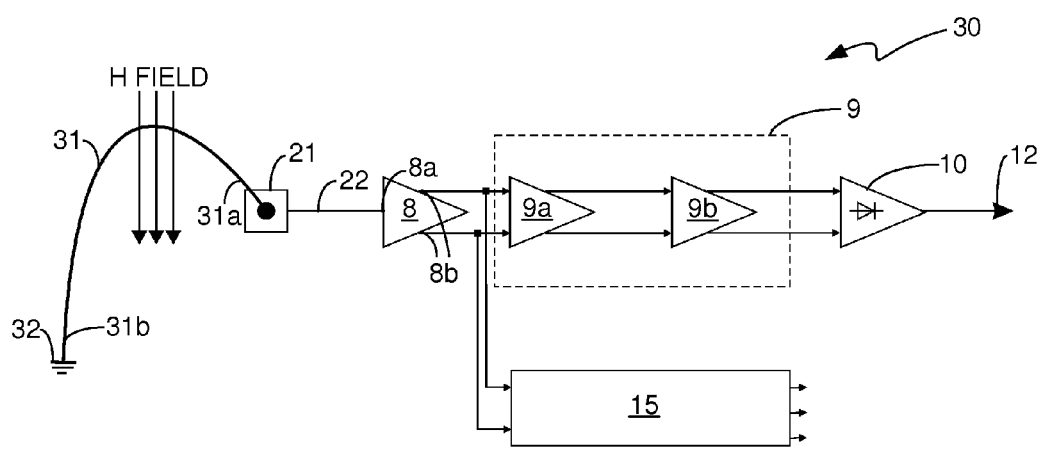
FIG. 3 illustrates a block diagram of a portion of a photodiode IC in accordance with another illustrative embodiment that includes the charge amplifier, the amplifier chain, the detector, the pad, the conductor, and the test circuitry shown in FIG. 2, and in addition includes an electrically-conductive bond wire.

FIG. 3 illustrates a block diagram of a portion of a photodiode IC 30 in accordance with another illustrative embodiment that includes the charge amplifier 8, the amplifier chain 9, the detector 10, the pad 21, the conductor 22, and the test circuitry 25 shown in FIG. 2, and in addition includes an electrically-conductive bond wire 31. For ease of illustration, the photodiode and the circuitry for amplifying the output of the photodiode are not shown in FIG. 3, but would be located proximate the circuitry shown in FIG. 3, e.g., next to the pad 21 and bond wire 31. A first end 31a of the bond wire 31 is connected to the pad 21 and a second end 31b of the bond wire 31 is connected to an electrical ground 32. The bond wire 31 acts as a magnetic field (H field) antenna in that the H field of any EMI to which the bond wire 31 is exposed will induce an electrical current in the bond wire 31. The electrical current causes electrical charge to accumulate on the input terminal 8a of the charge amplifier 8. The charge amplifier 8 then produces a differential output voltage at its output terminals 8b that is proportional to the electrical charge at its input terminal 8a.

Again, for exemplary purposes, the amplifier chain 9 is shown as being made up of first and second differential amplifiers 9a and 9b, respectively. The first differential amplifier 9a amplifies the voltage differential output by the charge amplifier 8 and produces a first amplified output differential voltage, which is input to the second differential amplifier 9b. The second differential amplifier 9b amplifies the first amplified output differential voltage to produce a second amplified output differential voltage, which is then input to the detector 10. The detector 10, which is optional, detects the second amplified output differential voltage and outputs an electrical signal 12 that is related to the level of the EMI to which the bond wire 31 was exposed. As indicated above, because the responses of the amplifiers 8-9b and of the detector 10 are known, a measurement of the level of the EMI can be obtained from the electrical signal 12.

Like the illustrative embodiment shown in FIG. 2, in accordance with this illustrative embodiment, the pad 21 is a test pad of the IC 30 and the IC 30 includes the test circuitry 25 for performing one or more on-chip tests at the chip or wafer levels. Therefore, this embodiment allows a test pad that is already on the IC 30 for performing testing to also be used as an E-field EMI antenna, which helps conserve space on the IC 30.

Figure 4:
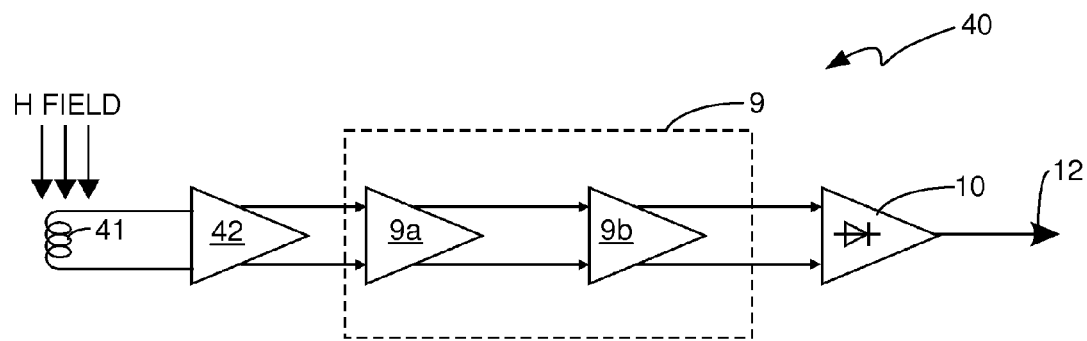
FIG. 4 illustrates a block diagram of a portion of a photodiode IC in accordance with another illustrative embodiment that includes the amplifier chain and the detector shown in FIGS. 1-3, and in addition includes an electrically-conductive coil and a current-to-voltage (I-V) amplifier.

FIG. 4 illustrates a block diagram of a portion of a photodiode IC 40 in accordance with another illustrative embodiment that includes the amplifier chain 9 and the detector 10 shown in FIGS. 1-3, and in addition includes an electrically-conductive coil 41 and an amplifier 42, which may be, for example, a current-to-voltage (I-V) amplifier that amplifies the current induced in the coil 41 or a voltage amplifier that amplifies the open circuit voltage of the coil 41. For ease of illustration, the photodiode and the circuitry for amplifying the output of the photodiode are not shown in FIG. 4, but would be located proximate the circuitry shown in FIG. 4, e.g., adjacent the coil 41. First and second ends of the coil 41 are connected to first and second input terminals, respectively, of the amplifier 42. The coil 41, which is typically made of metal, acts as a magnetic field (H field) antenna in that the H field of any EMI that the coil 41 is exposed to induces an electrical current in the coil 41. The electrical current causes electrical charge to accumulate on the input terminals of the amplifier 42. The amplifier 42 then produces a differential output voltage at its output terminals that is proportional to the current or voltage at its input terminals.

The first differential amplifier 9a amplifies the differential voltage output by the amplifier 42 and produces a first amplified output differential voltage, which is input to the second differential amplifier 9b. The second differential amplifier 9b amplifies the first amplified output differential voltage to produce a second amplified output differential voltage, which is then input to the detector 10. The detector 10 detects the second amplified output differential voltage and outputs an electrical signal 12 that is related to the level of the EMI to which the coil 41 was exposed. Because the responses of the amplifiers 42, 9a and 9b and of the detector 10 are known, a measurement of the level of the EMI can be obtained from the electrical signal 10.

Figure 5:
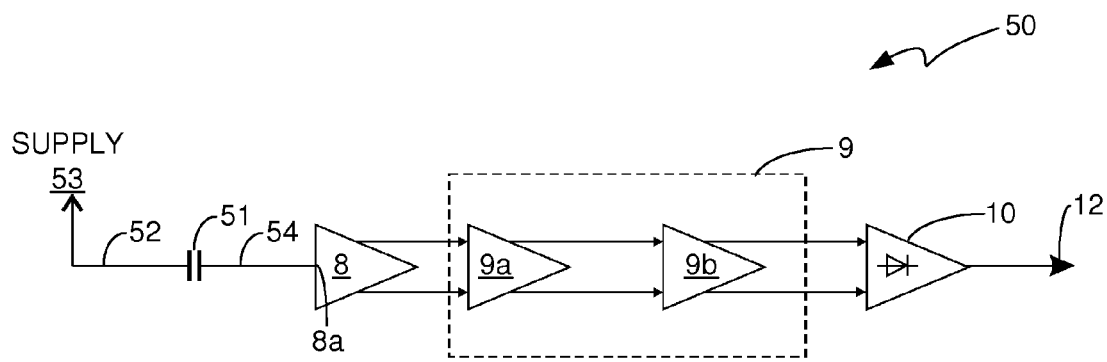
FIG. 5 illustrates a block diagram of a portion of a photodiode IC in accordance with another illustrative embodiment that includes the charge amplifier, the amplifier chain and the detector shown in FIGS. 1-3, and in addition includes an alternating current (AC) coupling capacitor.

FIG. 5 illustrates a block diagram of a portion of a photodiode IC 50 in accordance with another illustrative embodiment that includes the charge amplifier 8, the amplifier chain 9 and the detector 10 shown in FIGS. 1-3, and in addition includes an alternating current (AC) coupling capacitor 51. For ease of illustration, the photodiode and the circuitry for amplifying the output of the photodiode are not shown in FIG. 5, but would be located proximate the circuitry shown in FIG. 5, e.g., near the capacitor 51. A first terminal of the capacitor 51 is connected by a first lead 52 to an internal voltage supply 53 of the IC 50. A second terminal of the capacitor 51 is connected by a second lead 54 to the input terminal 8a of the charge amplifier 8. The capacitor 51, by nature, passes AC signals to the input terminal 8a of the charge amplifier 8, but blocks direct current (DC) signals. If the supply 53 is exposed to levels of EMI that are great enough to cause AC-type fluctuations in the supply 53 to occur, electrical charge will accumulate on the input terminal 8a of the charge amplifier 8. The charge amplifier 8 then produces a differential output voltage at its output terminals 8b that is proportional to the electrical charge at its input terminal 8a.

The first differential amplifier 9a amplifies the voltage differential output by the charge amplifier 8 and produces a first amplified output differential voltage, which is input to the second differential amplifier 9b. The second differential amplifier 9b amplifies the first amplified output differential voltage to produce a second amplified output differential voltage, which is then input to the detector 10. The detector 10 detects the second amplified output differential voltage and outputs an electrical signal 12 that is related to the level of the EMI to which the supply 53 was exposed. As indicated above, because the responses of the amplifiers 8-9b and of the detector 10 are known, a measurement of the level of the EMI can be obtained from the electrical signal 12.

Figure 6:
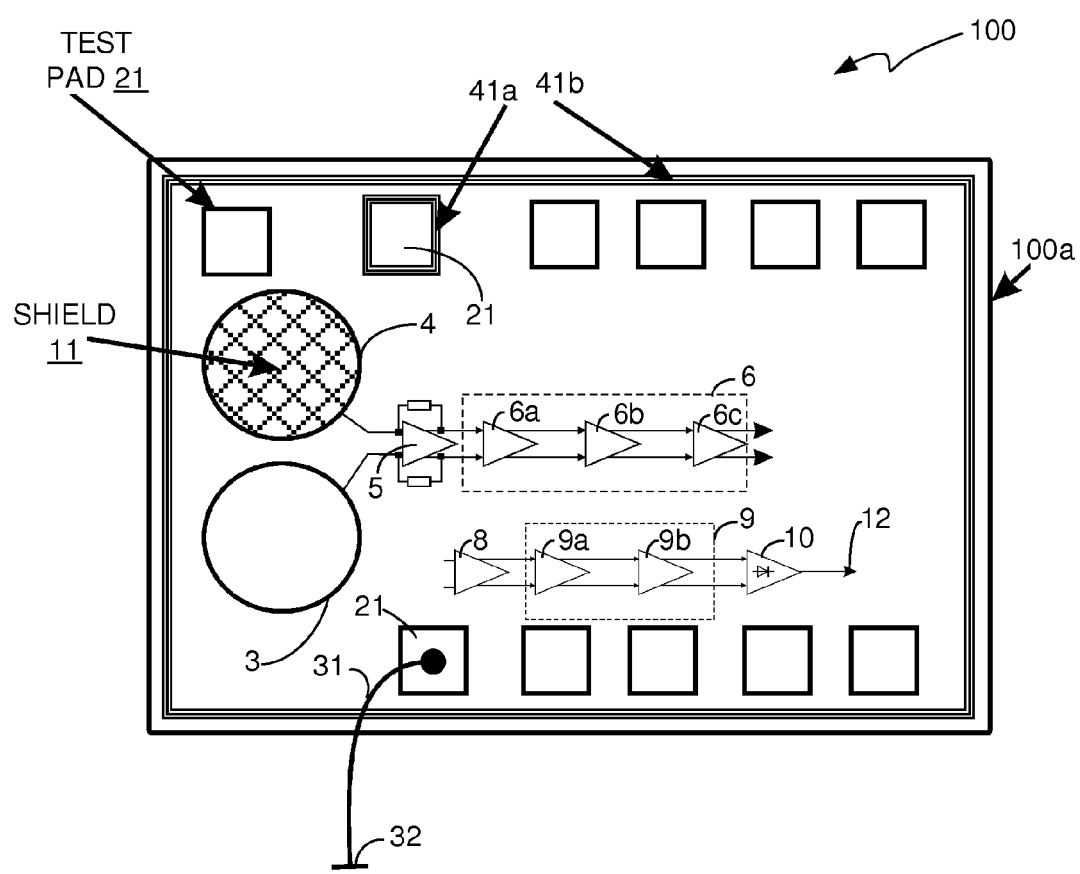
FIG. 6 illustrates a top plan view of a photodiode IC in accordance with another illustrative embodiment that comprises one or more of the configurations shown in FIG. 1-5.

FIG. 6 illustrates a top plan view of a photodiode IC 100 in accordance with another illustrative embodiment that comprises one or more of the configurations shown in FIG. 1-5. The coil 41 shown in FIG. 4 is depicted in FIG. 6 in two different locations with two different sizes. One of the coils 41a shown in FIG. 6 is coiled around an electrically-conductive contact pad 21, which may be the same pad shown in FIGS. 2 and 3. The other coil 41b shown in FIG. 6 is disposed about an outer periphery of the die 100a. The coil 41 need not be wound about the pad 21 or the periphery, but may be wound about any structure of the photodiode IC 100 that does not produce a magnetic field, such as relatively low-frequency elements of the IC 100 that perform housekeeping functions of the IC 100. The coil 41 may also be a freestanding structure that is not wound about any other structure.

Each of the coils 41a and 41b shown in FIG. 6 functions as an H-field EMI antenna that performs the function described above with reference to FIG. 4. The larger coil 41b disposed about the die periphery maximizes the size of the coil 41, which results in a larger current being induced in the coil 41b. The larger induced current means that the demands of the amplifier chain 9 can be relaxed, and therefore that the space that the amplifier chain 9 consumes can be reduced. The IC 100 has electrical conductors formed therein, such as vias and traces, for example, for interconnecting electrical components or elements of the IC 100. Because persons of skill in the art will understand how appropriate vias and traces can be formed in an IC for making all of the necessary connections, these vias and traces are not shown in FIG. 6 for ease of illustration and for purposes of clarity.

The bond wire 31 shown in FIG. 6 performs the same function as the bond wire 31 shown in FIG. 3 of detecting H-field EMI. The amplifiers 5-6c shown in FIG. 6 perform the same functions as the amplifiers 5-6c shown in FIG. 1. The amplifiers 8-9b and the detector 10 shown in FIG. 6 perform the same functions as the amplifiers 8-9b and the detector 10 shown in FIG. 1. Of course, many variations can be made to these amplification circuits. The photodiodes 3 and 4 shown in FIG. 6 correspond to the photodiodes 3 and 4 shown in FIG. 1. Thus, photodiode 4 shown in FIG. 6 is shielded by the metal shield 11, which functions as an optical barrier to light from unintended sources and as an E-field EMI antenna, as described above with reference to FIG. 1.

It can be seen from the description of the illustrative embodiments of FIGS. 1-6 that a variety of configurations of EMI sensors integrated on a photodiode IC can be achieved. The exemplary embodiments are merely a few examples of configurations that are suitable for this purpose, and those skilled in the art will understand that many variations and modifications can be made to these configurations and that other configurations can be designed for this purpose within the scope of the invention. The invention has been described with respect to these illustrative embodiments for the purpose of describing the principles and concepts of the invention. The invention is not limited to these embodiments, as will be understood by those skilled in the art in view of the description being provided herein.

What is claimed is:

1. An integrated circuit (IC) chip comprising:
   a first photodetector configured to convert a first optical signal into a first electrical signal and to output the first electrical signal from a cathode of the first photodetector;
   first amplification circuitry having a first input terminal that is electrically coupled to the cathode of the first photodetector, the first amplification circuitry amplifying the first electrical signal to produce a first amplified electrical signal;
   an electromagnetic interference (EMI) sensor adapted to sense EMI, the EMI sensor being configured to sense EMI and to produce an electrical sense signal;
   a second photodetector configured to convert a second optical signal into a second electrical signal and to output the second electrical signal from a cathode of the second photodetector; and
   second amplification circuitry having at least a first input terminal that is electrically coupled to the EMI sensor, the second amplification circuitry amplifying the electrical sense signal to produce an amplified electrical sense signal, wherein the first amplification circuitry comprises at least a first differential amplifier that amplifies a difference between the first and second electrical signals to produce the first amplified electrical signal.

2. The IC chip of claim 1, wherein the first photodetector is a first photodiode.

3. The IC chip of claim 2, wherein the photodiode is a p-intrinsic-n (P-I-N) diode.

4. The IC chip of claim 1, wherein the EMI sensor comprises an electrically-conductive coil having first and second ends that are connected to respective input terminals of the second amplification circuitry, wherein the coil detects a magnetic field of the EMI and produces the electrical sense signal.

5. The IC chip of claim 1, wherein the EMI sensor comprises an electrically-conductive pad disposed on the IC chip and electrically coupled by at least one electrical conductor to the first input terminal of the second amplification circuitry, wherein the pad detects an electric field of the EMI and produces the electrical sense signal.

6. The IC chip of claim 5, wherein the pad is a contact pad that is intended to be used for testing the IC chip, and wherein the IC chip further comprises:
   test circuitry for performing one or more tests, the test circuitry having input terminals that are electrically coupled to the second amplification circuitry.

7. The IC chip of claim 1, wherein the EMI sensor comprises an electrically-conductive bond wire having a first end that is connected to ground and having a second end that is connected to an electrically-conductive pad, the pad being electrically coupled by at least one electrical conductor to the first input terminal of the second amplification circuitry, wherein the bond wire detects a magnetic field of the EMI and produces the electrical sense signal.

8. The IC chip of claim 7, wherein the pad is a contact pad that is intended to be used for testing the IC chip, and wherein the IC chip further comprises:
   test circuitry for performing one or more tests, the test circuitry having input terminals that are electrically coupled to the second amplification circuitry.

9. An integrated circuit (IC) chip comprising:
   a first photodetector configured to convert a first optical signal into a first electrical signal and to output the first electrical signal from a cathode of the first photodetector;
   first amplification circuitry having a first input terminal that is electrically coupled to the cathode of the first photodetector, the first amplification circuitry amplifying the first electrical signal to produce a first amplified electrical signal;

an electromagnetic interference (EMI) sensor adapted to sense EMI, the EMI sensor being configured to sense EMI and to produce an electrical sense signal;

a second photodetector configured to convert a second optical signal into a second electrical signal and to output the second electrical signal from a cathode of the second photodetector; and second amplification circuitry having at least a first input terminal that is electrically coupled to the EMI sensor, the second amplification circuitry amplifying the electrical sense signal to produce an amplified electrical sense signal, wherein the EMI sensor comprises a capacitor, wherein the capacitor is electrically coupled via a first electrical conductor to a power supply of the IC chip and is electrically coupled via a second electrical conductor to the first input terminal of the second amplification circuitry, wherein the capacitor produces the electrical sense signal in response to alternating current (AC) fluctuations in the power supply that are caused by EMI.

10. The IC chip of claim 1, further comprising a signal detector, wherein the second amplification circuitry further comprises a charge amplifier and a differential amplifier chain, and wherein the charge amplifier amplifies the electrical sense signal and outputs the amplified electrical sense signal to the differential amplifier chain, and wherein the differential amplifier chain comprises at least one differential amplifier that further amplifies the amplified electrical sense signal prior to outputting the amplified electrical sense signal to the signal detector.

11. The IC chip of claim 1, further comprising:
a signal detector having at least a first input terminal that is electrically coupled to at least a first output terminal of the second amplification circuitry, the signal detector being configured to detect the amplified electrical sense signal and to output a detection signal related to the sensed EMI.

12. The IC chip of claim 1, wherein the EMI sensor comprises a metal shield disposed about the second photodetector, wherein the metal shield senses an electric field of the EMI and accumulates electrical charges to form the electrical sense signal.

13. A method for sensing electromagnetic interference (EMI) in a photodetector integrated circuit (IC) chip, the method comprising:
with a first photodetector of the IC chip, converting a first optical signal into a first electrical signal and outputting the first electrical signal; from a cathode of the first photodetector;

with first amplification circuitry of the IC chip electrically coupled to the first photodetector, amplifying the first electrical signal;

with a second photodetector of the IC chip, converting a second optical signal into a second electrical signal and outputting the second electrical signal from a respective cathode of the second photo detector;

with the first amplification circuitry of the IC chip electrically coupled to the second photodetector, amplifying the second electrical signal, wherein amplifying the first electrical signal and amplifying the second electrical signal generates a difference;

with an EMI sensor of the IC chip located proximate at least one of the first and second photodetectors, sensing EMI and outputting an electrical sense signal; and with second amplification circuitry coupled to the EMI sensor, amplifying the electrical sense signal to produce an amplified electrical sense signal.

14. The method of claim 13, wherein the first photodetector is a first photodiode.

15. The method of claim 14, wherein the photodiode is a p-intrinsic-n (P-I-N) diode.

16. The method of claim 13, wherein the EMI sensor comprises a metal shield disposed about the second photodetector, wherein the metal shield senses an electric field of EMI and accumulates electrical charges to form the electrical sense signal.

17. The method of claim 13, wherein the EMI sensor comprises an electrically-conductive coil having first and second ends that are connected to respective input terminals of the second amplification circuitry, wherein the coil detects a magnetic field of the EMI and produces the electrical sense signal.

18. The method of claim 13, wherein the EMI sensor comprises an electrically-conductive pad disposed on the IC chip and electrically coupled by at least one electrical conductor to the first input terminal of the second amplification circuitry, wherein the pad detects an electric field of the EMI and produces the electrical sense signal.

19. The method of claim 18, wherein the pad is a contact pad that is intended to be used for testing the IC chip, the method further comprising: with test circuitry of the IC chip having input terminals that are electrically coupled to the second amplification circuitry, performing one or more tests on the IC chip.

20. The method of claim 13, wherein the EMI sensor comprises an electrically-conductive bond wire having a first end that is connected to ground and having a second end that is connected to an electrically-conductive pad, the pad being electrically coupled by at least one electrical conductor to the first input terminal of the second amplification circuitry, wherein the bond wire detects a magnetic field of the EMI and produces the electrical sense signal.

21. The method of claim 20, wherein the pad is a contact pad that is intended to be used for testing the IC chip, the method further comprising: with test circuitry of the IC chip having input terminals that are electrically coupled to the second amplification circuitry, performing one or more tests on the IC chip.

22. The method of claim 13, wherein the EMI sensor comprises a capacitor, wherein the capacitor is electrically coupled via a first electrical conductor to a power supply of the IC chip and is electrically coupled via a second electrical conductor to the first input terminal of the second amplification circuitry, wherein the capacitor produces the electrical sense signal in response to alternating current (AC) fluctuations in the power supply that are caused by EMI.

23. The method of claim 16, wherein the second amplification circuitry further comprises a charge amplifier and a differential amplifier chain, and wherein the method further comprises:
with the charge amplifier, amplifying the electrical sense signal and outputting the amplified electrical sense signal to the differential amplifier chain; and
with at least one differential amplifier of the differential amplifier chain, further amplifying the amplified electrical sense signal prior to outputting the amplified electrical sense signal to a signal detector.

24. The method of claim 13, further comprising: with a signal detector electrically coupled to the second amplification circuitry, detecting the amplified electrical sense signal and producing a detection signal related to the sensed EMI.

* * * * *